United States Patent [19]

Matthews et al.

[11] Patent Number: 5,737,275
[45] Date of Patent: Apr. 7, 1998

[54] WORD LINE SELECTION CIRCUIT FOR STATIC RANDOM ACCESS MEMORY

[75] Inventors: Frank Matthews; Junji Ueoka, both of Tokyo, Japan

[73] Assignee: NEC Corporation, Tokyo, Japan

[21] Appl. No.: 614,152

[22] Filed: Mar. 12, 1996

[30] Foreign Application Priority Data

Mar. 17, 1995 [JP] Japan ............................ 7-057854

[51] Int. Cl.$^6$ .......................................... G11C 7/00
[52] U.S. Cl. ............... 365/226; 365/189.09; 365/230.06
[58] Field of Search ....................... 365/189.09, 230.06, 365/226, 189.11; 327/534, 536, 537

[56] References Cited

U.S. PATENT DOCUMENTS

| | | | |
|---|---|---|---|
| 5,406,523 | 4/1995 | Foss | 365/226 |
| 5,550,504 | 8/1996 | Ogihara | 327/537 |

OTHER PUBLICATIONS

M. Ukita et al.; "A Single–Bit–Line Cross–Point Cell Activation (SCPA) Architecture for Ultra–Low–Power SRAM's"; IEEE Journal of Solid–State Circuits, vol. 28, no. 11, Nov. 1993; pp. 1114–1118.

*Primary Examiner*—A. Zarabian
*Attorney, Agent, or Firm*—Whitham, Curtis, Whitham & McGinn

[57] ABSTRACT

The semiconductor memory device disclosed has a boost circuit, a word drive circuit and a row decoder, and includes a first P-channel MOS transistor, a second P-channel MOS transistor, a first N-channel MOS transistor, and a second N-channel MOS transistor. The first P-channel MOS transistor and the second P-channel MOS transistor have drains and gates cross-connected and each source and a substrate connected to an output terminal of the boost circuit. The first N-channel MOS transistor has a drain connected to the drain of the first P-channel MOS transistor, a source connected to a ground terminal, and a gate connected to an output terminal of the row decoder. The second N-channel MOS transistor has a source connected to the output terminal of the row decoder, a drain connected to the drain of the second P-channel MOS transistor, and a gate receiving one of a power supply voltage and a control signal. The gate of the N-channel word driver can be driven directly from the row decoder whereby the select and non-select ratio is improved.

13 Claims, 8 Drawing Sheets

5,737,275

WORD LINE SELECTION CIRCUIT FOR STATIC RANDOM ACCESS MEMORY

BACKGROUND OF THE INVENTION

(1) Field of the Invention

The present invention relates to a semiconductor memory device, and more particularly to a word line selection circuit for a Static Random Access Memory (SRAM).

(2) Description of the Related Art

Recently, due to the trend of low voltage systems, there is an increasing desire for the realization of low voltage operation and low power consumption of SRAMs. In a typical memory cell of a SRAM, it is not possible, due to operational requirements, to lower the power supply voltage to a voltage lower than a sum of the threshold voltage of a N-channel transistor and a threshold voltage of a transfer gate transistor which constitute a flip flop circuit. In practice, a back-gate bias develops between a source of the above-mentioned transfer gate transistor and a substrate so that, for reasons such as a rise of effective threshold voltage and a need for taking manufacturing variations and temperature characteristics into consideration, it becomes inevitable for a minimum guarantee voltage of the power supply to be high.

A conventional word line selection circuit which has been proposed as being suitable for low voltage operation of a SRAM is shown in FIG. 1. The word line selection circuit 1 proposed is constituted by a row decoder circuit 2, a word driver circuit 3, and a boost voltage generating circuit 4. FIG. 1 illustrates four circuits but, since they are the same circuits, only one of them is explained here. The word driver circuit 3 is constituted by P-channel transistors $Q_{P1}$ and $Q_{P2}$ having drains and gates cross-connected and each source and a substrate connected to the boost voltage generating circuit 4, an N channel transistor $Q_{N6}$ for pulling down word lines, and a transfer gate transistor $Q_{NT1}$ having a low threshold voltage.

Now, the operation of the above word line selection circuit is explained with reference to signal waveforms shown in FIG. 2. When a row decoder output $\Phi_x$ is low, the word line $WL_x$ is in a non-select state. That is, $\Phi_x$ is low, the voltage at a node C drops to a voltage determined by a ratio of the three kinds of transistors, that is, the transistor $Q_{P2}$, the transistor $Q_{NT1}$ and N-channel transistors (stacked four transistors but not illustrated). Where the output voltage of the boost voltage generating circuit 4 is $V_{BST}$ and the threshold voltage of the $Q_{P1}$ is $V_{tp}$, if the voltage of the node C is lowered to a level lower than $V_{BST}-|V_{tp}|$, the transistor $Q_{P1}$ becomes ON, and the word line $WL_x$ and the gate voltage of the transistor $Q_{P2}$ rise to $V_{BST}$.

During the transition from a select state to a non-select state of the word line, first the output $\Phi_x$ of the row decoder $ND_1$ rises from 0 V to $V_{cc}$. Where the threshold voltage of the transfer gate transistor $Q_{NT1}$ is $V_{tnt}$, the node C rises up to $V_{cc}-V_{tnt}$. As a result, the transistor $Q_{N6}$ turns ON, and the voltage of the word line $WL_x$ and the gate of the $Q_{P2}$ drops to a level determined by a ratio of the transistors $Q_{P1}$ and $Q_{N6}$. When the voltage of the word line $WL_x$ drops to a level lower than $V_{BST}-|V_{tp}|$, the transistor $Q_{P2}$ turns ON and the node C rises up to $V_{BST}$. By this feedback effect, the transistor $Q_{P1}$ turns OFF and the word line $WL_x$ drops to 0 V.

Problems that exist in the prior art word line circuit are explained with reference to FIG. 1. The selection speed of the word line is determined essentially by the ratio of the transistor $Q_{P2}$ versus the transistor $Q_{NT1}$ and the four stacked N-channel transistors (not shown) of the row decoder $ND_1$ and the P-channel transistor $Q_{P1}$. Since the transfer gate transistor $Q_{NT1}$ is interposed between the output of the row decoder $ND_1$ and the transistor $Q_{P2}$, there is a corresponding deterioration of the ratio of this circuit. To compensate for this, it is required to make the transistor $Q_{NT1}$ large but doing so results in an increase in the area of the word line selection circuit 1. Further, in order to charge the word line $WL_x$ at a high speed by the P-channel transistor $Q_{P1}$, it is necessary to make the transistor area considerably large. However, in order to improve the ratio concerned, the N-channel transistor $Q_{N6}$ must also be made large, resulting in an increase in the chip area.

Next, a problem encountered when the word line $WL_x$ is changed to a non-conductive state is explained. The main reason that determines non-select speeds resides in a ratio of the transistors $Q_{P1}$ and $Q_{N6}$ and, especially under a low voltage state, the ratio has to be brought up to approximately 2. If, in order to increase the driving capability, the area of the transistor $Q_{P1}$ is made larger, the area of the transistor $Q_{N6}$ becomes about two times as large as that of the transistor $Q_{P1}$. For causing the word line to discharge at a high speed by the N-channel transistor $Q_{N6}$, it is necessary, as a natural consequence, for the area of the transistor $Q_{N6}$ to be made large, and this is a cause for necessitating an increase in the area of the word line selection circuit 1.

A second problem is that, when the threshold voltage of the transfer gate transistor $Q_{NT1}$ becomes large, the gate voltage of the transistor $Q_{N6}$ is lowered resulting in the ratio deterioration. In particular, when a low voltage operation at a voltage lower than 2.5 V is attempted, the problem of ratio deterioration becomes very serious. Conventionally, as a method to lower the threshold voltage, an ion implantation process has been additionally carried out, but this increases the number of masks thereby increasing the manufacturing cost.

A third problem is that the boost speed of the boost voltage generating circuit 4 is slow. When the P-channel transistor $Q_{P2}$ is ON, the gate of the transistor $Q_{N6}$ is connected with an output terminal $V_{bout}$ of the boost voltage generating circuit 4 through a channel region of the transistor $Q_{P2}$.

A large number of word driver circuits 3 having large transistor areas are connected to the terminal $V_{bout}$ resulting in a large parasitic capacitance. For this reason, the boost speed of the boost voltage generating circuit 4 is considerably slowed down.

FIG. 3 is an equivalent circuit diagram of the boost voltage generating circuit. $C_{bst}$ represents boost capacitance, $R_1$ represents ON-resistance of the P-channel transistor of a CMOS inverter, $C_2$ and $R_2$, respectively, represent parasitic capacitance and parasitic wiring resistance as observed relatively from $V_{bout}$ towards the word line selection circuit.

When the circuit of FIG. 3 is analyzed on the assumption that the boost voltage $V_{BST}(t)$ is charged to $V_{cc}$ under the initial condition of t=0, $V_{BST}(t)$ may be expressed by the following equation (1):

$$V_{BST}(t)=V_{cc} \cdot ((2C_{bst}+C_2)/(C_{bst}+C_2)-(C_{bst}/(C_{bst}+C_2))\cdot\text{EXP}(-t/\tau)) \quad (1)$$

In this case, the time constant $\tau$ is given by the following equation (2):

$$\tau=C_{bst} \cdot C_2 \cdot (R_1+R_2)/(C_{bst}+C_2) \quad (2)$$

The voltage $V_{BST}$ upon completion of the boosting obtained by the equation (1) wherein t=∞ may be expressed by the following equation (3):

$$V_{BST} = (2C_{bst} + C_2) \cdot V_{cc}/(C_{bst} + C_2) \quad (3)$$
$$= (2 + C_2/C_{bst}) \cdot V_{cc}/(1 + C_2/C_{bst})$$

That is, $V_{BST}$ is determined by a ratio between $C_2$ and $C_{bst}$. When the equation (3) is solved by $C_2/C_{bst}$, the following equation (4) is obtained:

$$C_2/C_{bst} = (2V_{cc} - V_{BST})/(V_{BST} - V_{cc}) \quad (4)$$

From the equation (4), it can be appreciated that, when $V_{BST}$ is boosted up to 1.5 times the $V_{cc}$, it is necessary to satisfy $C_{bst} = C_2$. In this case, the equation (2) is changed as:

$$\tau = 0.5 C_2 \cdot (R_1 + R_2) \quad (5)$$

Therefore, the boost voltage generating circuit 4 is directly influenced by a large gate capacitance of the N-channel transistor $Q_{N6}$, and the boost speed is lowered. In FIG. 1, when the boost voltage is applied to the word driver circuit 3, the transfer gate transistor $Q_{NT1}$ has a role of electrically separating the P-channel transistors (not shown) of the row decoder $ND_1$ from the node C. That is, when the output of the row decoder $ND_1$ and the node C are directly coupled, the voltage of the node C tends to be boosted to the boost voltage $V_{BST}$ as the $Q_{P2}$ is turned ON but, since the current flows to the N-well which is biased to $V_{cc}$ from the drain of the P-channel transistor of the row decoder $ND_1$, $V_{BST}$ is clamped to a value which is a sum of a forward voltage of the diode and $V_{cc}$. Thus, a further problem in the prior art is that, since one N-channel transfer gate transistor $Q_{NT1}$ has been used in each of the word driver circuits 3 to receive outputs of the row decoder $ND_1$, the word line selection circuit 1 has inevitably occupied a large area.

SUMMARY OF THE INVENTION

An object of the present invention, therefore, is to overcome the problems existing in the prior art, and to provide an SRAM in which the speed of select and non-select operations is improved and the chip area can be made small.

According to one aspect of the invention, there is provided a semiconductor memory device having a boost circuit for raising a voltage to above a power supply voltage, a word drive circuit for driving a word line, and a row decoder for selecting the word driver circuit by an address input signal, the semiconductor memory device comprising:

a first P-channel MOS transistor and a second P-channel MOS transistor having drains and gates cross-connected and having each source and a substrate connected to an output terminal of the boost circuit;

a first N-channel MOS transistor having a drain connected to the drain of the first P-channel MOS transistor, a source connected to a ground terminal, and a gate connected to an output terminal of the row decoder; and a second N-channel MOS transistor having a source connected to the output terminal of the row decoder, a drain connected to a drain of the second P-channel MOS transistor, and a gate receiving one of a power supply voltage and a control signal.

In the prior art word line select circuit, the transfer gate transistor $Q_{NT1}$ has caused the ratio deterioration during the selection and non-selection operation. However, according to the invention, since the output of the row decoder and the gate of the N-channel driver are directly coupled, the ratio of the two during the selection and non-selection operation is significantly improved.

Also, in the prior art word line select circuit, a large number of N-channel drivers each having a large transistor area are connected to the output terminal $V_{bout}$ of the boost voltage generating circuit 4, thus necessitating the boost capacitance $C_{bst}$ to be large and also making it difficult for the boost voltage to be boosted at a high speed. According to the invention, however, the $V_{bout}$ and the N-channel word driver are completely separated electrically so that the parasitic capacitance and the parasitic wiring resistance that exists at the $V_{bout}$ are significantly reduced, and it is possible to make the boost capacitance small and to enhance the boost speed of the boost voltage generating circuit.

According to the invention, the timing of the rise/fall of the voltage by the boost voltage generating circuit and the timing of the select/non-select are optimized and, as a consequence, the mutual conductance of the P-channel transistor during the selection and non-selection operation is lowered. This enables the improvement of the ratio of the selection/non-selection as compared with that in the prior art circuit.

Further, whereas the gate of the transistor $Q_{NT1}$ is biased to the power supply voltage in the prior art circuit, the decoder control signal in the circuit according to the invention is inputted to the gate of the transfer gate transistor which electrically separates the output of the row decoder from the boost voltage generating circuit. In this way, the number of the row recorders can be reduced to ¼ that of the prior art, and the chip area can be reduced accordingly.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
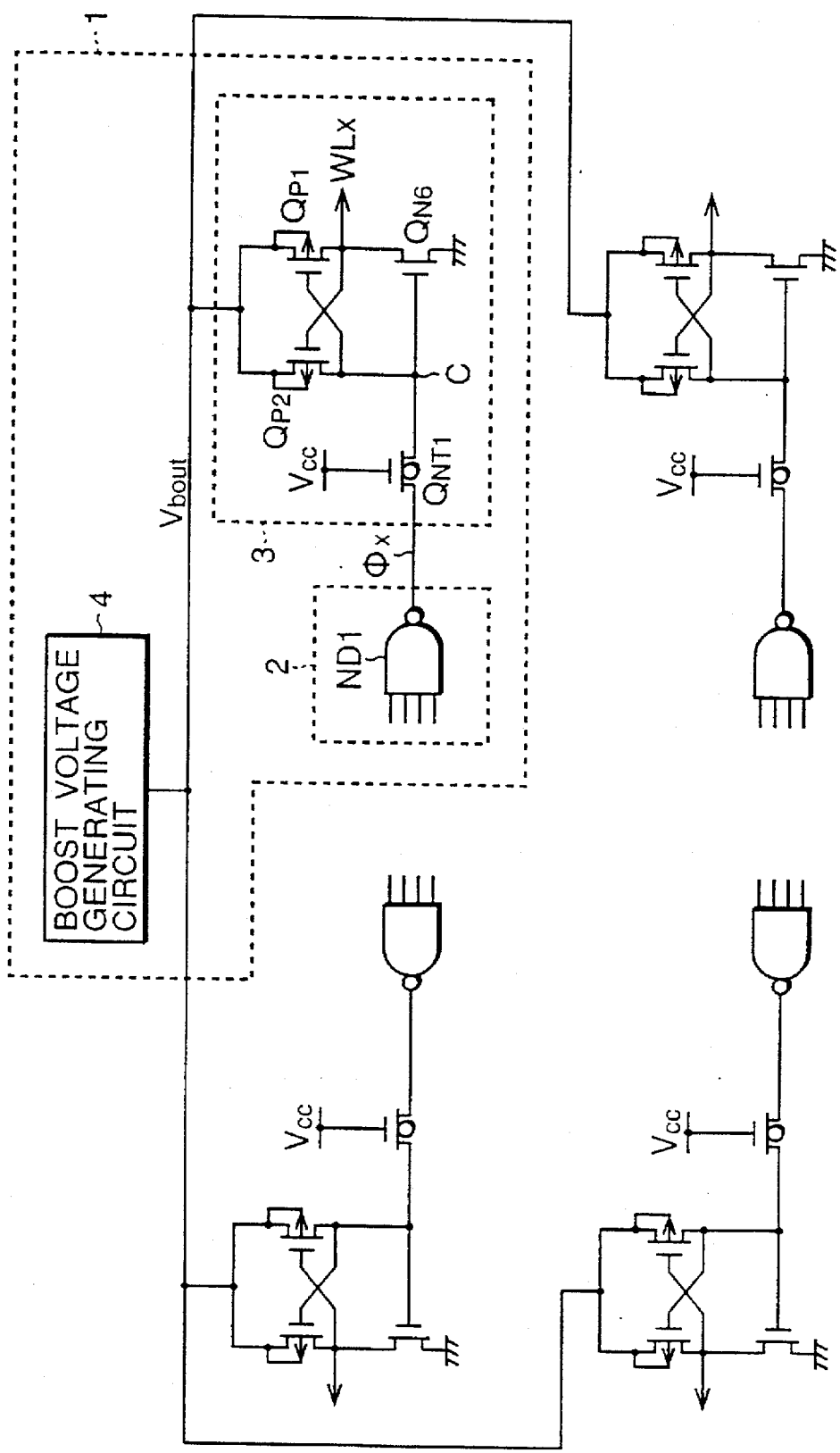
FIG. 1 is a circuit diagram showing a conventional word line selection circuit.
Figure 2:
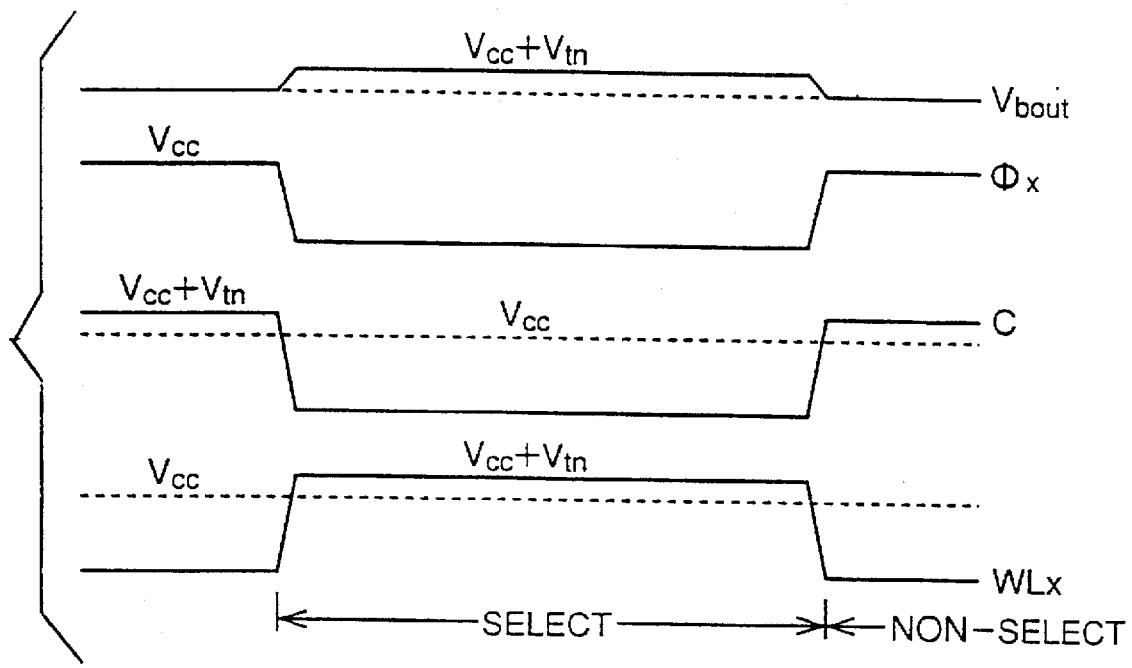
FIG. 2 is a diagram showing waveforms for use in explaining the operation of the conventional word line selection circuit shown in FIG. 1.
Figure 3:
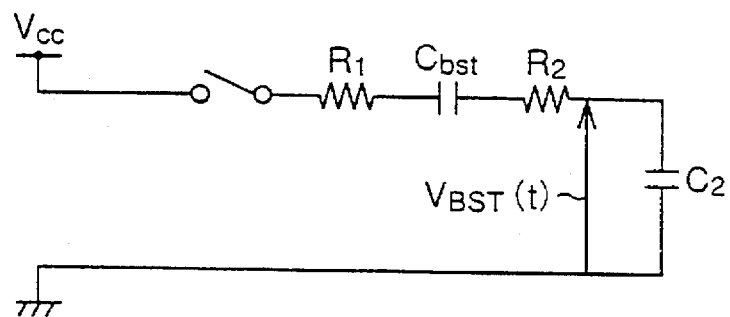
FIG. 3 is an equivalent circuit diagram of the boost voltage generating circuit in the conventional word line select circuit shown in FIG. 1.
Figure 4:
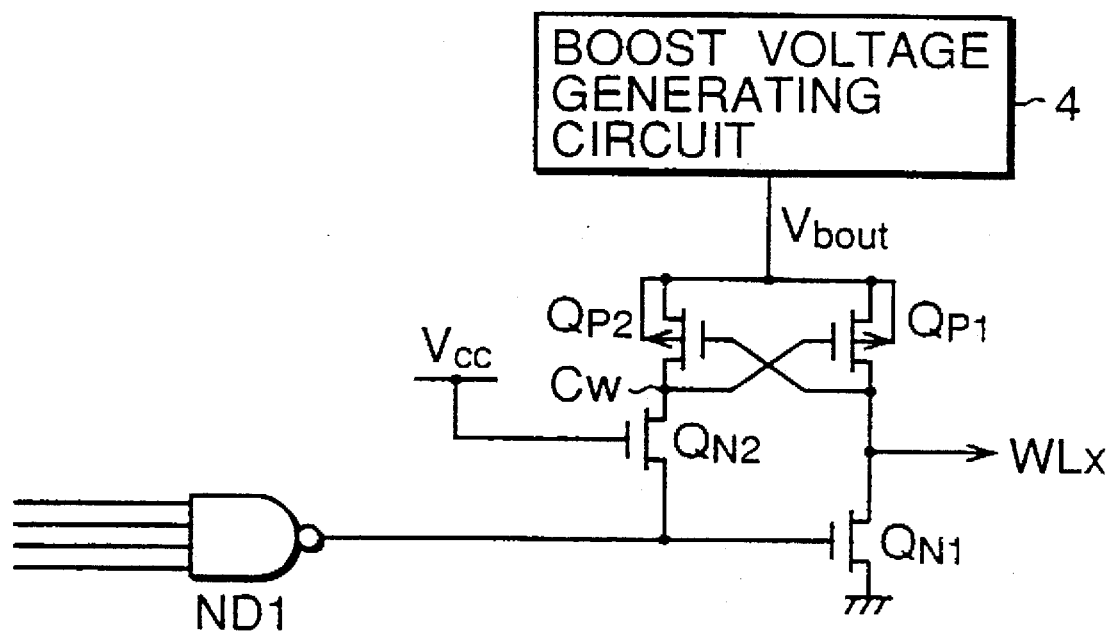
FIG. 4 is a circuit diagram showing a circuit of a first embodiment according to the invention.

FIG. 4 shows a circuit arrangement of a first embodiment according to the invention. The decoder system is the same as that in the prior art circuit shown in FIG. 1, but the word driver circuit is improved in the selection/non-selection ratio over that in the prior art circuit. When the word line $WL_x$ is selected, the input voltages of the transistors $Q_{N6}$ and $Q_{P1}$ in the prior art word driver circuit (FIG. 1) are the same as each other but, in the word driver circuit according to the invention shown in FIG. 4, the input voltage of the N-channel driver $Q_{N1}$ is always lower than the input voltage of the transistor $Q_{P1}$, which means that the selection ratio is improved over that in the prior art circuit. Also, in the prior art circuit (FIG. 1), for the word line to be non-selected, where the threshold voltage of the transfer gate transistor $Q_{NT1}$ is $V_{mt}$, the input voltage of the transistor $Q_{N6}$ becomes $V_{cc}-V_{mt}$, hence lower than $V_{cc}$, so that the mutual conductance of the transistor $Q_{N6}$ is lowered.

On the other hand in the circuit according to the invention, the input of the N-channel driver $Q_{N1}$ changes to $V_{cc}$ and, since there is no loss in the voltage and the mutual conductance of the transistor $Q_{N1}$ is improved, the non-select ratio is enhanced. Also, under the non-select state, the source voltage of the transistor $Q_{N2}$ has changed to $V_{cc}$ and, since the transistor $Q_{N2}$ has turned to an OFF state, the gate capacitance of the N-channel driver $Q_{N1}$ has been separated by the transistor $Q_{N2}$ from the output $V_{bout}$ of the boost voltage generating circuit 4. Thus, the parasitic capacitance becomes small as the voltage rises so that the boost capacitance $C_{bst}$ of the boost voltage generating circuit 4 can be made significantly small and the boost speed can be raised.

The low threshold voltage transfer gate transistor is indispensable in the prior art word driver circuit but this is not so in the circuit of the present invention. For the select operation, the speed of the word drive circuit according to the invention at power supply voltage of 2.0 V is almost the same as that in the prior art circuit but, above 2.5 V, this speed becomes significantly higher when the select ratio of the P-channel transistor and the N-channel transistor is made 1:2. Further, for the non-select operation, the word driver circuit according to the invention operates at a high speed and, under a low voltage, this effect is especially significant.

Thus, in the SRAM according to the invention explained above, the select and non-select operations are at high speeds, the chip area is reduced and the time for the exposure process is reduced.

Figure 5:
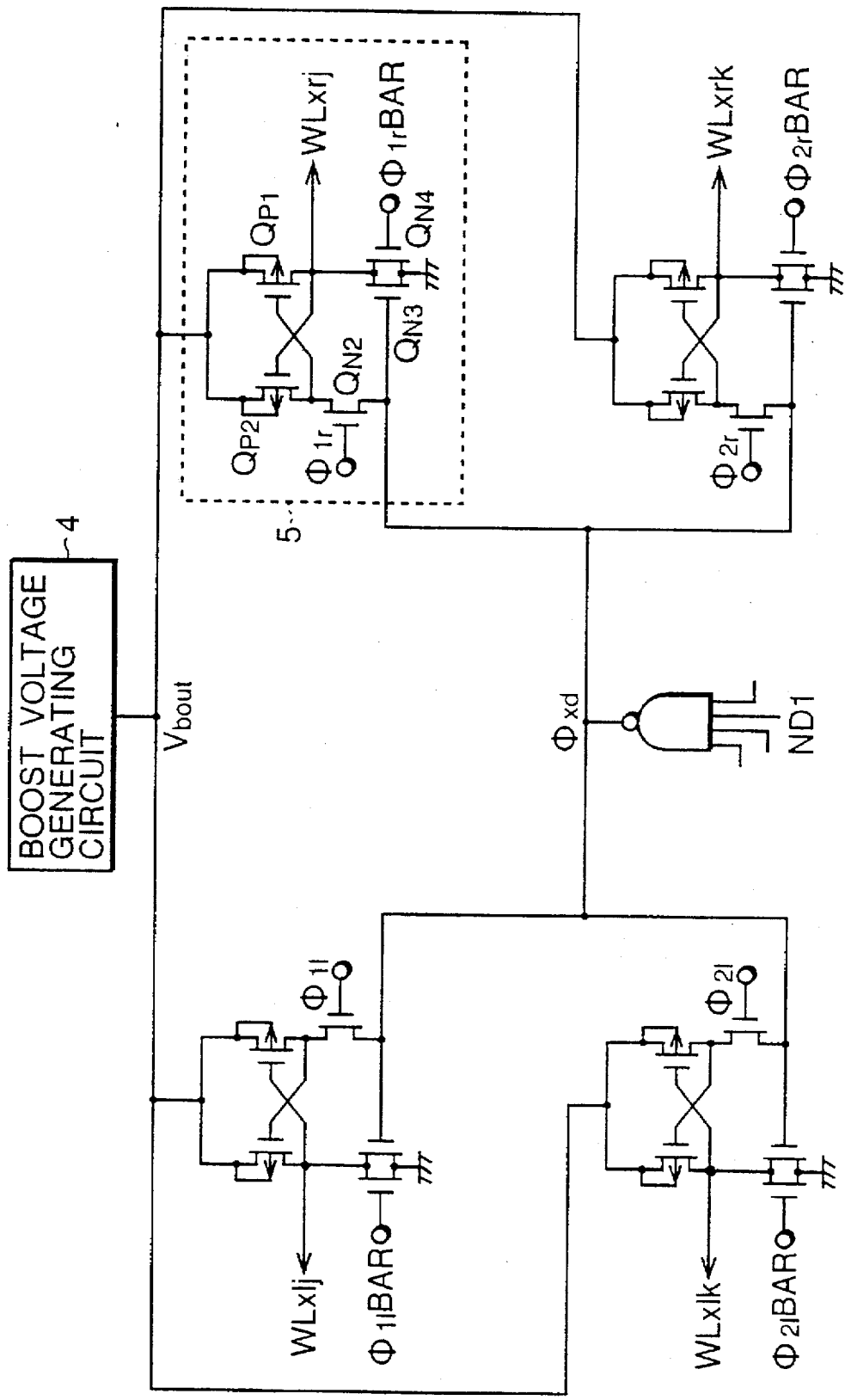
FIG. 5 is a circuit diagram showing a circuit of a second embodiment according to the invention.

Now, a second embodiment of the invention is explained with reference to FIG. 5. The prior art circuit includes an $ND_1$ which is one row decoder provided for each word driver circuit but the circuit according to the invention includes a NAND circuit which is one row decoder provided for every four word driver circuits. According to the invention, the control of the select and non-select of the four word driver circuits is made by $\Phi_{1r}$, $\Phi_{1r}$-bar ("bar" meaning an inverse value of the parameter concerned), $\Phi_{2r}$, $\Phi_{2r}$-bar, $\Phi_{11}$, $\Phi_{11}$-bar, and $\Phi_{21}$ and $\Phi_{21}$-bar. These signals are generated from the signals from the address transition detection circuit and the address signals. In this embodiment, the N-channel transistor $Q_{N4}$ is added to each word driver circuit. This transistor is needed for the word line to be made non-selected by each word driver circuit.

Figure 6:
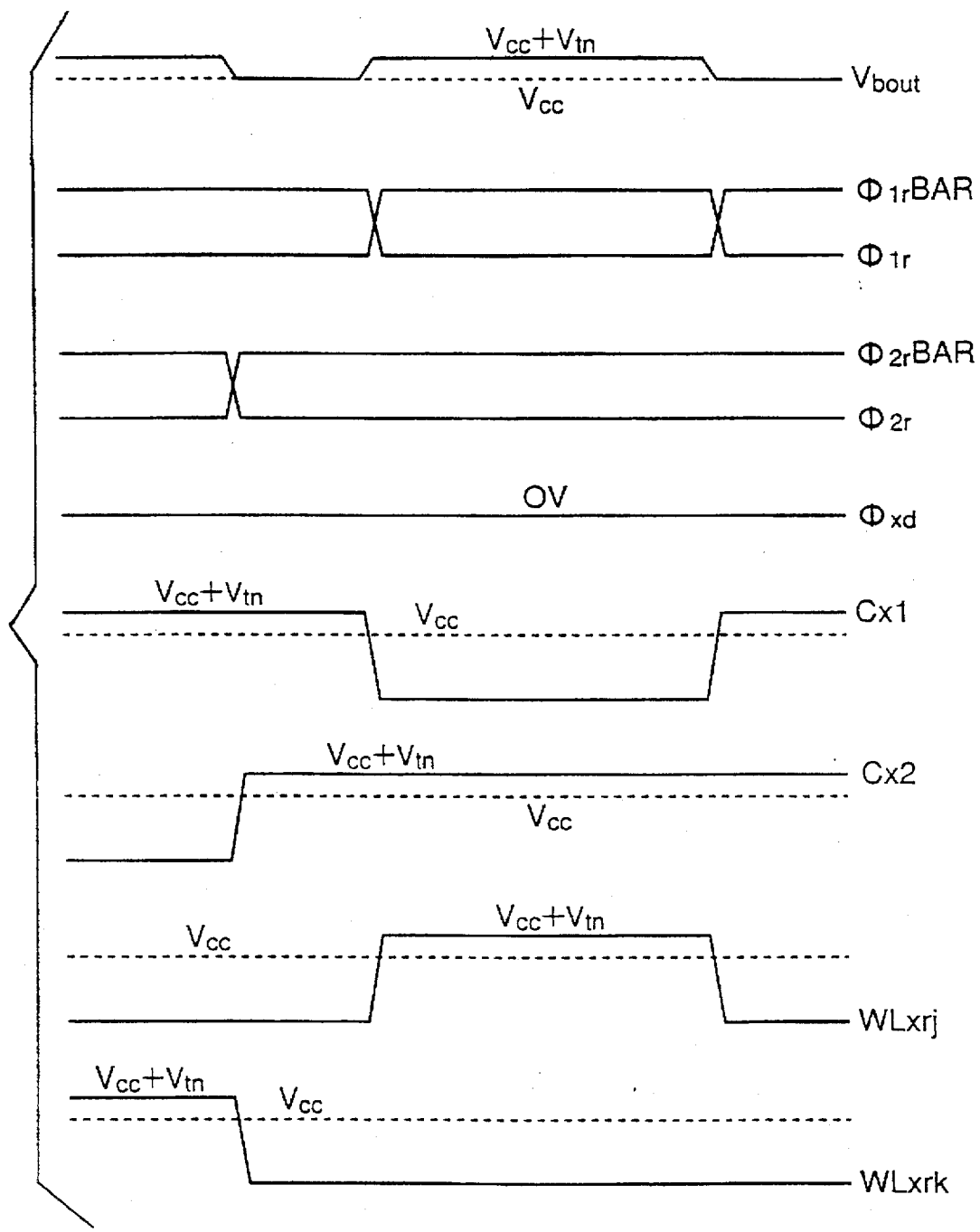
FIG. 6 is a diagram showing waveforms for use in explaining the operation of the circuit of the second embodiment according to the invention.

Now, the operation of the above circuit for select and non-select of the word line is explained with reference to FIG. 5. The four word driver circuits shown in FIG. 5 are the same circuit, and respectively drive the word lines $WL_{xrj}$, $WL_{xrk}$ and $WL_{xlj}$, $WL_{xlk}$. Thus, only the word drive circuit 5 which drives the word line $WL_{xrj}$ is explained hereinafter. As shown by signal waves in FIG. 6, when the row decoder output $\Phi_{xd}$ turns to a low level, $\Phi_{1r}$ to a high level, and $\Phi_{1r}$-bar to a low level, both the transistors $Q_{N3}$ and $Q_{N4}$ turn OFF and $Q_{P1}$ turns ON so that the word line $WL_{xrj}$ is selected. As a result, the word line changes its voltage to a boost voltage ($V_{BST}=V_{cc}+V_{tn}$). Then, when the $\Phi_{1r}$ is changed to a low level and the $\Phi_{1r}$-bar to a high level, the transistor $Q_{N4}$ becomes ON and the transistor $Q_{P1}$ becomes OFF so that the word line $WL_{xrj}$ is non-selected. The word line in the circuit according to the invention is configured such that one row decoder controls the four word driver circuits and, thus, the area of the row decoder is significantly reduced.

Figure 7:
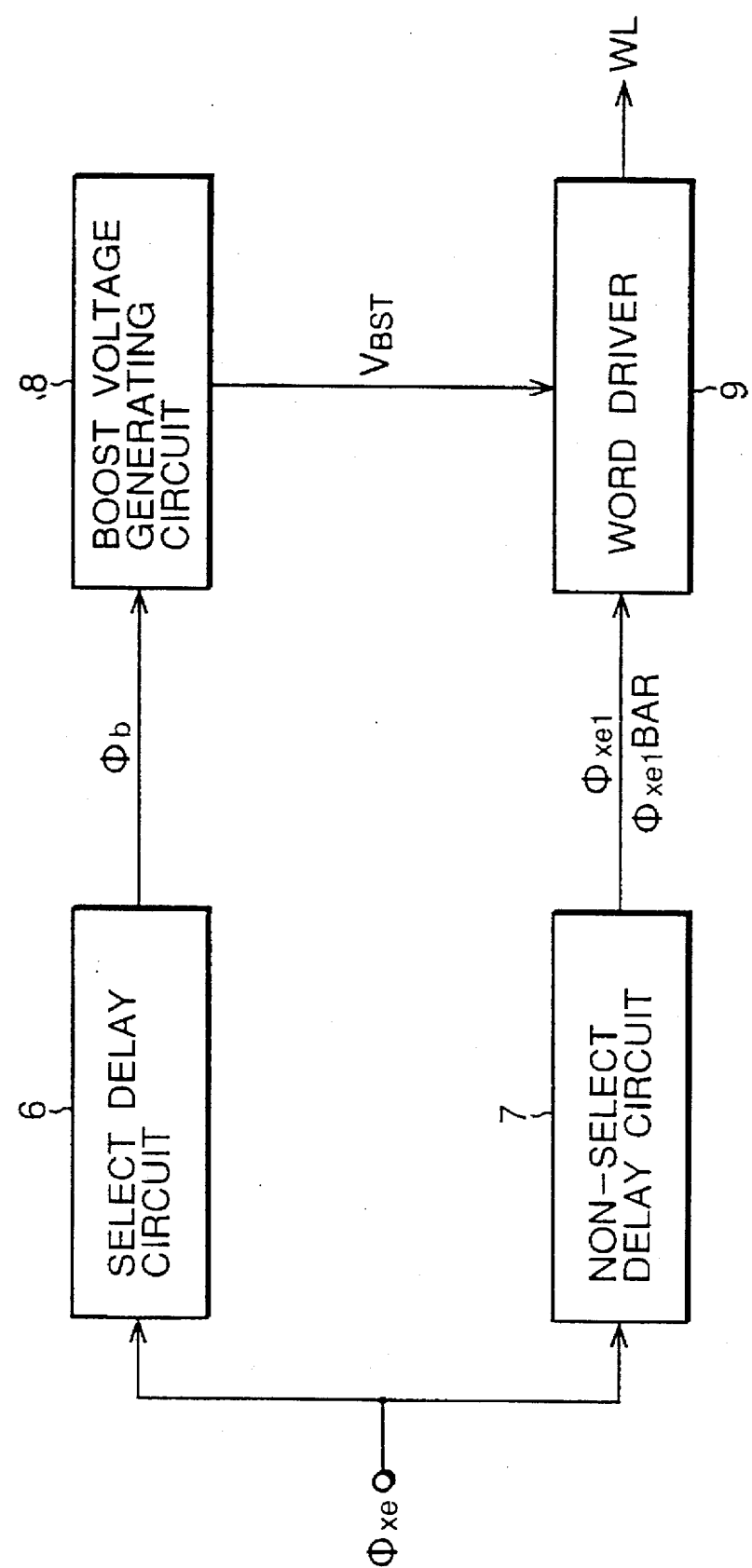
FIG. 7 is a block diagram showing an arrangement of a third embodiment according to the invention.
Figure 8:
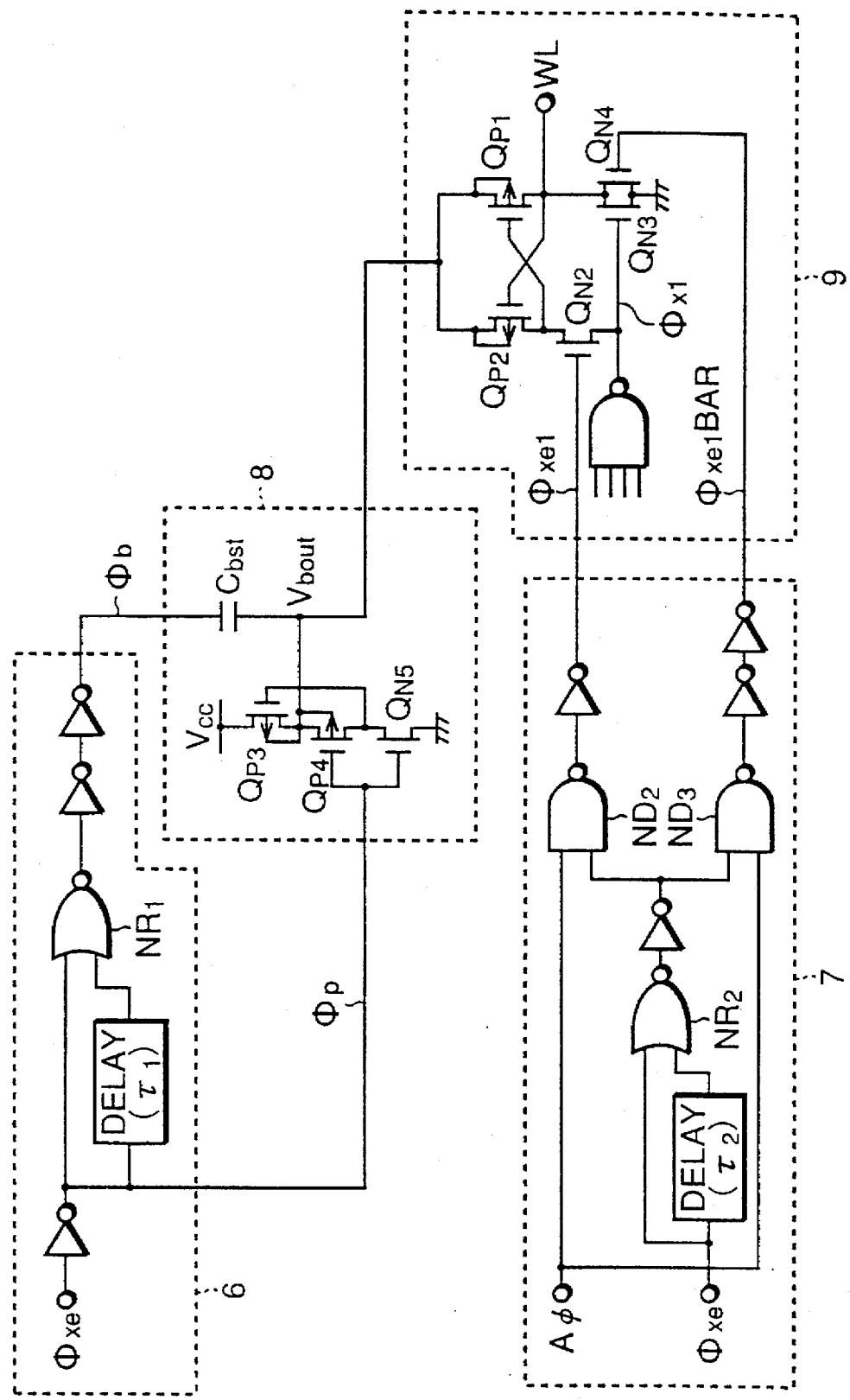
FIG. 8 is a circuit diagram showing a gate level circuit configuration of the arrangement shown in FIG. 7.
Figure 9:
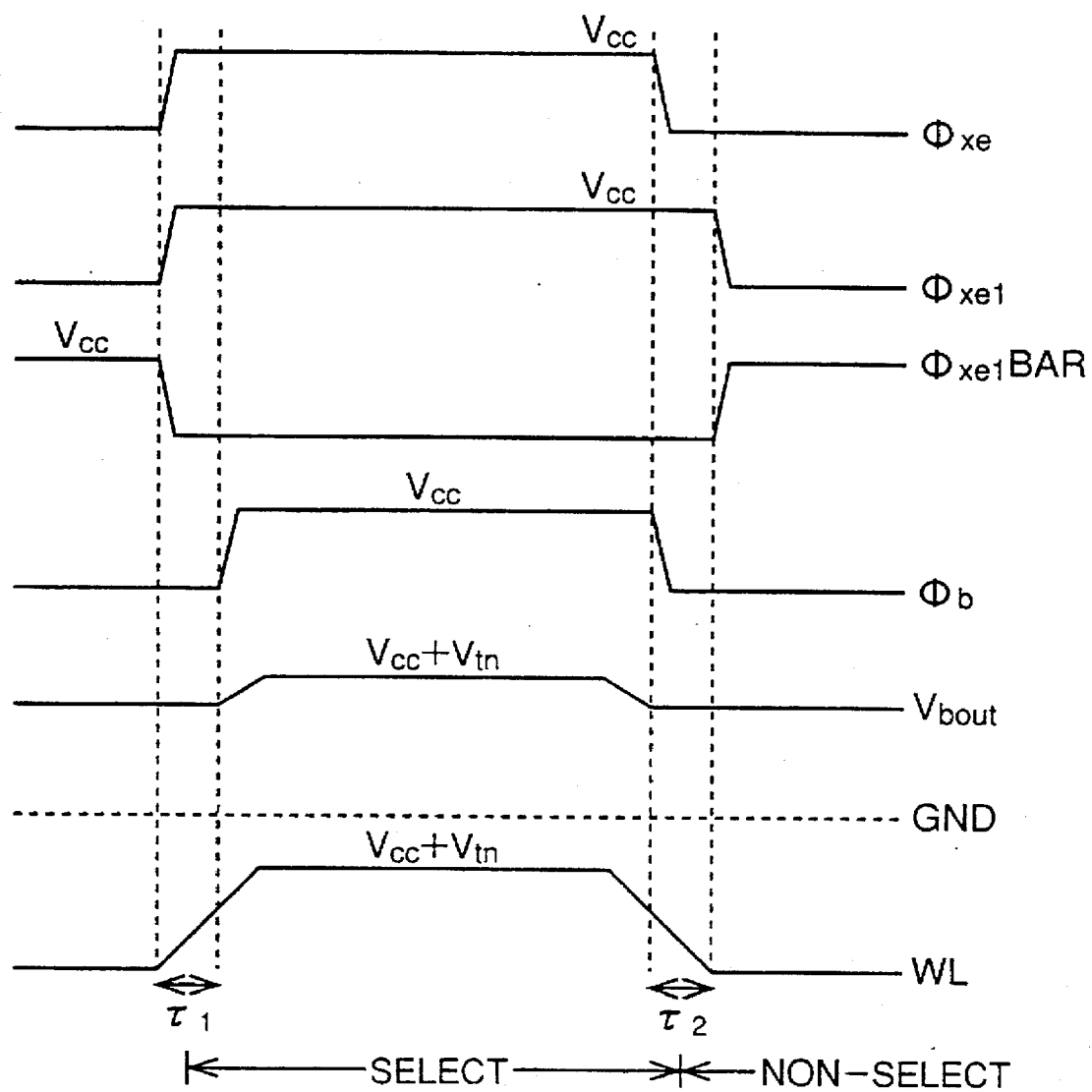
FIG. 9 is a diagram showing signal waveforms obtained in the circuit of FIG. 8.

A third embodiment of the invention are explained with reference to FIGS. 7, 8 and 9. FIG. 7 is a block diagram showing the third embodiment. FIG. 8 is a circuit diagram showing a gate level circuit configuration of the circuit shown in FIG. 7, and FIG. 9 shows signal waveforms obtained in the circuit of FIG. 8. Initially, a reset signal $A\phi$ is set to a high level. Immediately before the word line WL is selected, a select enable signal $\Phi_{xe}$ of the word line is made a low level, an input $\Phi_p$ of the inverter constituted by the transistors $Q_{P4}$ and $Q_{N5}$ becomes a high level. At this time, the P-channel transistor $Q_{P3}$ turns ON so that an output terminal $V_{bout}$ of the boost voltage generating circuit 8 is precharged to $V_{cc}$. On the other hand, since the select/non-select control signals $\Phi_{xe1}$ and $\Phi_{xe1}$-bar of the word driver circuit 9 are respectively at a low level and a high level, the word line WL is in a low level state.

When the $\Phi_{xe}$ is made a high level for selecting the word line, the $\Phi_{xe1}$ becomes a high level and the $\Phi_{xe1}$-bar becomes a low level. Thus, the transistor $Q_{P1}$ becomes ON and the word line WL is selected. Then, after a delay $\tau_1$ shown at $V_{bout}$ in FIG. 9, the boost voltage raised to the boost capacity is generated and the boost voltage is applied to the word line through the transistor $Q_{P1}$.

Next, the $\Phi_{xe}$ is set to a low level for the word line to be made non-select. As seen from the select delay circuit shown 6 in FIG. 8 and the $\Phi_b$ signal show in FIG. 9, the $V_{bout}$ does not undergo a delay and, when it begins to restore to the power supply voltage $V_{cc}$, the voltage of the word line WL correspondingly begins to fall. On the other hand, as seen from the non-select delay circuit 7 shown in FIG. 8 and the $\Phi_{xe1}$ and $\Phi_{xe1}$-bar signals shown in FIG. 9, the $\Phi_{xe1}$ signal and the $\Phi_{xe1}$-bar signal respectively change to a low level and high level after a delay of $\tau_2$ after the $\Phi_{xe}$ signal begins to fall. Thus, the transistor $Q_{N2}$ becomes OFF and the transistor $Q_{N6}$ becomes ON so that the word line restores to 0 V.

In this third embodiment, in the selection operation, the select ratio is improved because the word driver circuit is selected immediately before the voltage rises. In this way, the voltage across the respective gates and sources of the P-channel transistors $Q_{P1}$ and $Q_{P2}$ is $V_{cc}$, that is, the voltage before the voltage rise, and this voltage is lower than when a boost voltage is applied.

Thus, the mutual conductance of the transistors $Q_{P1}$ and $Q_{P2}$ are lowered, thus resulting in the ratio improvement. Optimum delay values vary depending on circuits, but normal values for both $\tau_1$ and $\tau_2$ may be several nanoseconds. Also, for the non-select operation, as shown by the signal waveforms of the $V_{bout}$ and the signal waveforms of the word line WL in FIG. 9, the output voltage $V_{BST}$ of the boost voltage generating circuit is already lowered to the power supply voltage $V_{cc}$ immediately before the word line WL is non-selected. In this way, as already explained in connection with the select operation, the non-select ratio is improved thereby enabling the reduction in the transistor area of the N-channel driver and, as a result, in the chip area.

In the circuit according to the invention, it is possible to drive the gate of the N-channel word driver directly from the row decoder thereby improving the select and non-select ratio. Thus, the speed of the select and non-select operation is improved and the chip area can be made small. Further, since the transistor having a low threshold voltage which was required is the prior art is not required, it is possible to eliminate the exposure process that is otherwise required.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor memory device having a boost circuit for raising a voltage to above a power supply voltage, a word drive circuit for driving a word line, and a row decoder for selecting said word driver circuit by an address input signal, said semiconductor memory device comprising:

a first P-channel MOS transistor and a second P-channel MOS transistor having drains and gates cross-connected and having each source and each substrate of said first P-channel MOS transistor and said second P-channel MOS transistor connected to an output terminal of said boost circuit;

a first N-channel MOS transistor having a drain connected to the drain of said first P-channel MOS transistor, a source connected to a ground terminal, and a gate connected to an output terminal of said row decoder;

a second N-channel MOS transistor having a source connected to said output terminal of said row decoder, a drain connected to a drain of said second P-channel MOS transistor, and a gate receiving one of said power supply voltage and a control signal; and a third N-channel MOS transistor having a source connected to the ground terminal, a drain connected to the drain of said first P-channel MOS transistor, and a gate receiving one of said power supply voltage and an inverse control signal for pulling said word line to ground in a non-selected state independent of said row decoder.

2. A semiconductor memory device according to claim 2, where an output voltage of said boost circuit rises after a first predetermined delay time from a time when charging is initiated through said first P-channel MOS transistor.

3. A semiconductor memory device according to claim 1, wherein after said word line has started discharging through said first N-channel transistor, said first P-channel transistor is made non-conductive after a second predetermined delay time.

4. A static memory device comprising a boost circuit for raising a voltage to above a power supply voltage, a row decoder, and a word line driver for driving a word line, comprising:

a first P-channel MOS transistor and a second P-channel MOS transistor having drains and gates cross-connected and having each source and each substrate of said first P-channel MOS transistor and said second P-channel MOS transistor connected to an output terminal of said boost circuit;

a first N-channel MOS transistor having a drain connected to the drain of said first P-channel MOS transistor, a source connected to a ground terminal, and a gate connected to an output terminal of said row decoder;

a second N-channel MOS transistor having a source connected to said output terminal of said row decoder, a drain connected to a drain of said second P-channel MOS transistor, and a gate receiving one of said power supply voltage and a control signal; and a third N-channel MOS transistor having a source connected to the ground terminal, a drain connected to the drain of said first P-channel MOS transistor, and a gate receiving a complement of said control signal.

5. A static memory device comprising a boost circuit for raising a voltage to above a power supply voltage, a row decoder, and a word line driver as recited in claim 4 wherein said third N-channel MOS transistor comprises a pull-down transistor to pull said word line to a logic low in response to said complement of said control signal.

6. A static memory device comprising a boost circuit for raising a voltage to above a power supply voltage, a row decoder, and a word line driver as recited in claim 4 wherein said an output voltage of said boost circuit rises after a first predetermined delay after charging is initiated through said first P-channel MOS transistor.

7. A static memory device comprising a boost circuit for raising a voltage to above a power supply voltage, a row decoder, and a word line driver as recited in claim 4 wherein after said word line has started discharging through said first N-channel transistor, said first P-channel transistor turns off after a second predetermined delay time.

8. A static memory device comprising a boost circuit for raising a voltage to above a power supply voltage, a row decoder, and a word line driver as recited in claim 4 further comprising:

a select delay circuit for receiving a select enable signal and outputting a pre-charge signal to said boost circuit; and a non-select delay circuit receiving said select enable signal and generating both a select signal and a non-select signal to said word line driver, wherein said non-select signal activates said third N-channel MOS transistor to pull said word line to a logic low.

9. A static memory device comprising a boost circuit for raising a voltage to above a power supply voltage, a row decoder, and a word line driver as recited in claim 8 wherein said select delay circuit comprises a first delay $\tau_1$ and said non-select delay circuit comprises a second delay $\tau_2$.

10. A static memory device comprising a boost circuit for raising a voltage to above a power supply voltage, a row decoder, and a word line driver as recited in claim 9 wherein $\tau_1$ comprises a delay between said select enable signal and said pre-charge signal.

11. A static memory device comprising a boost circuit for raising a voltage to above a power supply voltage, a row decoder, and a word line driver as recited in claim 9 wherein $\tau_2$ comprises a delay between said select signal and a non-select signal to said word line driver.

12. A static memory device comprising a boost circuit for raising a voltage to above a power supply voltage, a row decoder, and a word line driver as recited in claim 8 wherein said a non-select delay circuit further receives a reset signal.

13. A static memory device comprising a boost circuit for raising a voltage to above a power supply voltage, a row decoder, a word line driver as recited in claim 12 wherein said reset signal is logically combined with said select enable signal to output said select signal and a non-select signal.

* * * * *